(12) United States Patent
Hoshika et al.

(10) Patent No.: US 10,886,660 B2
(45) Date of Patent: Jan. 5, 2021

(54) ELECTRONIC DEVICE INCLUDING HINGE PART SUPPORTING INNER LID ROTATABLY

(71) Applicant: Panasonic Intellectual Property Management Co., Ltd., Osaka (JP)

(72) Inventors: Naoki Hoshika, Osaka (JP); Kenichi Shindo, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/516,460

(22) Filed: Jul. 19, 2019

(65) Prior Publication Data

US 2019/0341719 A1 Nov. 7, 2019

Related U.S. Application Data

(63) Continuation of application No. PCT/JP2018/005418, filed on Feb. 16, 2018.

(30) Foreign Application Priority Data

Feb. 24, 2017 (JP) .................................. 2017-033311

(51) Int. Cl.
| | | |
|---|---|---|
| *H01R 13/52* | (2006.01) | |
| *G06F 1/16* | (2006.01) | |
| *H01R 13/447* | (2006.01) | |

(52) U.S. Cl.
CPC ....... *H01R 13/5213* (2013.01); *G06F 1/1656* (2013.01); *H01R 13/447* (2013.01); *H01R 2201/06* (2013.01)

(58) Field of Classification Search
CPC .............. H01R 13/4532; H01R 13/447; H01R 13/5213; H05K 5/03
(Continued)

(56) References Cited

U.S. PATENT DOCUMENTS 3,716,815 A * 2/1973 Riches ................. H01R 13/447
439/142
6,991,490 B1 * 1/2006 Su ...................... H01R 13/5213
439/136
(Continued)

FOREIGN PATENT DOCUMENTS

JP 2007-305353 A 11/2007
JP 2008-042771 A 2/2008
(Continued)

OTHER PUBLICATIONS

International Search Report for corresponding Application No. PCT/JP2018/005418, dated May 15, 2018.

*Primary Examiner* — Abdullah A Riyami
*Assistant Examiner* — Marcus E Harcum
(74) *Attorney, Agent, or Firm* — Renner, Otto, Boisselle & Sklar, LLP (57) ABSTRACT

A lid that blocks an opening of a housing of a computer includes an inner lid, an outer lid, and a water stop member. The inner lid includes an engagement hole at an end of the inner lid on a side close to a hinge axis. The housing includes an engagement projection that is engaged with the engagement hole when the inner lid is rotationally moved until the inner lid faces a bottom surface. The outer lid includes a right protrusion at an end of the outer lid on a side far from the hinge axis. The housing includes an engagement recess that is engaged with the right protrusion when the outer lid is slid away from the hinge axis.

9 Claims, 7 Drawing Sheets

(58) Field of Classification Search
USPC .................................................. 439/136, 142
See application file for complete search history.

(56) References Cited

U.S. PATENT DOCUMENTS

| | | | | |
|---|---|---|---|---|
| 8,199,464 B2* | 6/2012 | Zuo | ...................... | H01R 13/447 |
| | | | | 200/302.1 |
| 9,083,109 B2* | 7/2015 | Tetsuya | ................ | H01R 13/447 |
| 9,147,960 B2* | 9/2015 | Kojima | ................ | H01R 13/447 |
| 9,161,467 B2* | 10/2015 | Murakata | ............. | H05K 5/0086 |
| 2009/0219676 A1* | 9/2009 | Murakata | ............. | H05K 5/0086 |
| | | | | 361/679.01 |
| 2013/0044420 A1 | 2/2013 | Iwamoto | | |
| 2014/0113467 A1* | 4/2014 | Senatori | ............... | H01R 13/447 |
| | | | | 439/142 |
| 2014/0170871 A1* | 6/2014 | Wu | ...................... | H01R 13/447 |
| | | | | 439/131 |
| 2018/0224896 A1* | 8/2018 | Shindo | ...................... | G06F 1/16 |

FOREIGN PATENT DOCUMENTS

| | | |
|---|---|---|
| JP | 2012-018772 A | 1/2012 |
| JP | 2013-062234 A | 4/2013 |
| WO | WO-2015097940 A1 * | 7/2015 |

* cited by examiner

ELECTRONIC DEVICE INCLUDING HINGE PART SUPPORTING INNER LID ROTATABLY

TECHNICAL FIELD

The present disclosure relates to an electronic device having a lid that blocks an opening of a housing.

BACKGROUND ART

PTL 1 discloses an electronic device having a watertight lid that blocks an opening of a housing. The watertight lid is connected to the housing through a fixing part made of a resin that functions as a hinge and blocks the opening of the housing when the watertight lid is closed.

CITATION LIST

Patent Literature

PTL 1: Unexamined Japanese Patent Publication No. 2013-62234

SUMMARY

In a case where the hinge is made of a resin as described above, the lid may undesirably soften and plastically deform in a lid opening direction in a situation where the electronic device is left under a high-temperature environment. As a result, waterproof performance may undesirably decrease.

The present disclosure provides a technique for suppressing a decrease in waterproof performance of an electronic device having a lid that blocks an opening of a housing.

An electronic device according to an aspect of the present disclosure includes a housing including an opening provided in a predetermined surface of the housing; an electronic component in the housing; a hinge part; and a lid that blocks the opening, the lid being connected to the housing through the hinge part.

The lid includes an inner lid, an outer lid, and a water stop member attached to an inner surface of the inner lid.

The hinge part has a hinge axis parallel with the predetermined surface, is connected to one end of the inner lid, and supports the inner lid rotatably about the hinge axis.

The outer lid is supported by the inner lid and slides along an outer surface of the inner lid in a direction perpendicular to the hinge axis.

The water stop member blocks the opening by making contact with a periphery of the opening of the predetermined surface when the inner lid is rotationally moved until the inner lid faces the predetermined surface.

The inner lid includes a first engagement part at an end of the inner lid on a side close to the hinge axis.

The housing includes a second engagement part that is engaged with the first engagement part when the inner lid is moved rotationally until the inner lid faces the predetermined surface.

The outer lid includes a third engagement part at an end of the outer lid on a side far from the hinge axis.

The housing includes a fourth engagement part that is engaged with the third engagement part when the outer lid is slid away from the hinge axis.

According to the technique of the present disclosure, the lid is engaged with the housing not only at an end on a side far from the hinge axis, but also at an end on a side close to the hinge axis. This suppresses loosening of closing of the lid even in a case where the lid is plastically deformed in a lid opening direction. It is therefore possible to suppress a decrease in waterproof performance of an electronic device having a lid that closes an opening of a housing.

DESCRIPTION OF EMBODIMENTS

Exemplary embodiments will be described in detail below with reference to the accompanying drawings as appropriate. However, description that is more detailed than necessary may be omitted. For example, the detailed description of already well-known matters and redundant description of substantially the same configuration may be omitted. This is to avoid unnecessary redundancy in the following description and to facilitate understanding by those skilled in the art.

Note that the present inventor will provide the accompanying drawings and the following description for those skilled in the art to sufficiently understand the present disclosure, and thus does not intend to limit the subject matter described in the claims

First Exemplary Embodiment

A first exemplary embodiment will be described below with reference to the drawings.

[1. Configuration]

[1-1. Outline]

Figure 1:
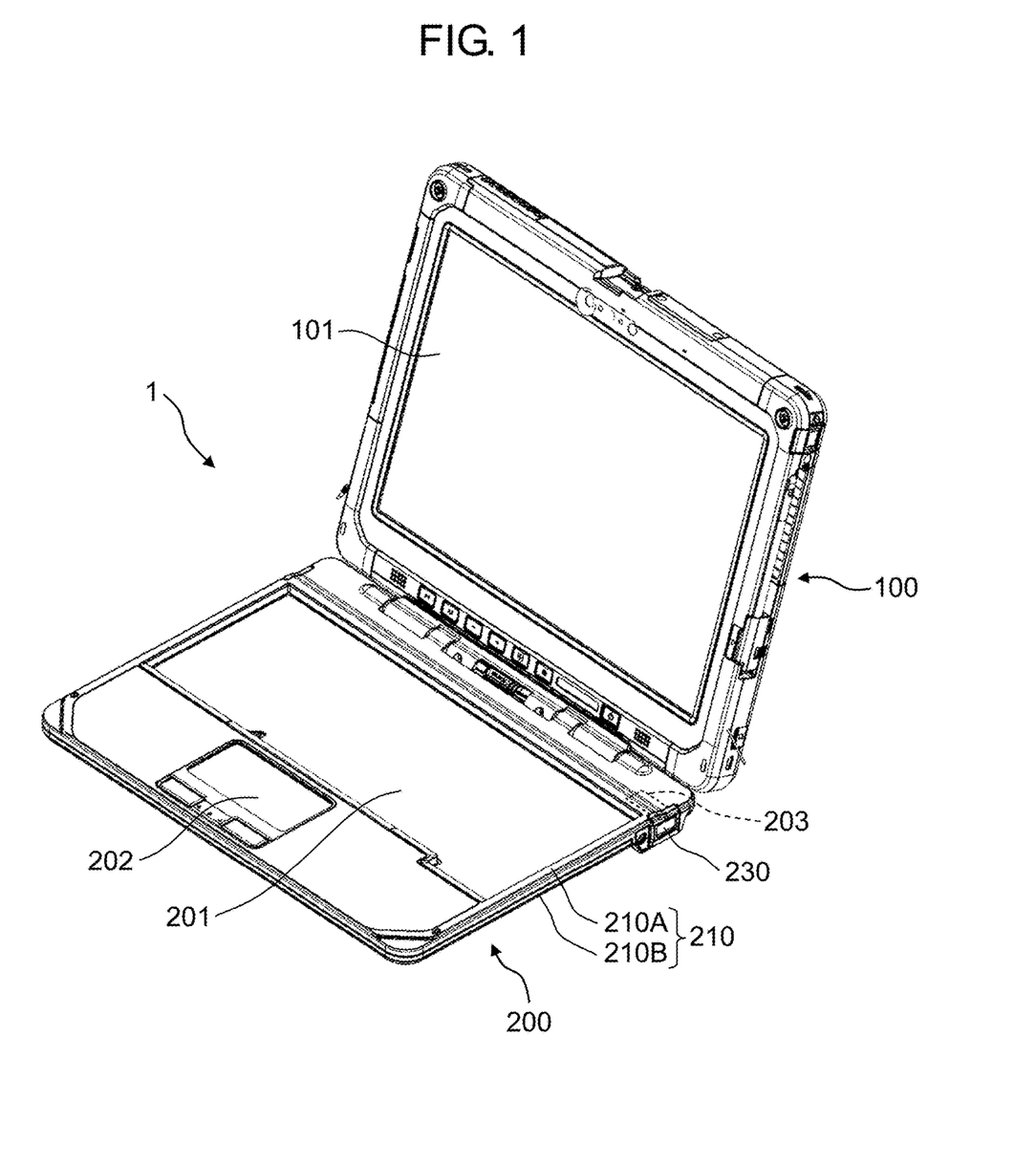
FIG. 1 is a perspective view of a computer according to the first exemplary embodiment.

FIG. 1 is a perspective view of a computer according to the first exemplary embodiment. Computer 1 is an example of an electronic device. Computer 1 has tablet computer 100 and keyboard unit 200.

Display 101 having a touch panel is provided on a front face of tablet computer 100. Various electronic components such as a central processing unit (CPU), a memory, a solid state drive (SSD), an image processor, and a communication module are contained in tablet computer 100.

Keyboard unit 200 has keyboard 201 including a plurality of keys (the keys are not illustrated) and touch pad 202. Keyboard unit 200 has an interface (not illustrated) for transmitting and receiving data to and from tablet computer 100 and an external device interface for connection with an external device. Various electronic components such as a keyboard controller and a touch pad controller are contained in keyboard unit 200.

Local area network (LAN) connector 203 to which a LAN cable is connectable is contained in a right side part of keyboard unit 200. Housing 210 is provided with lid 230 that can be opened and closed, and lid 230 faces an insertion port of LAN connector 203.

[1-2. Structure of Lid Disposition Part]

Figure 2A:
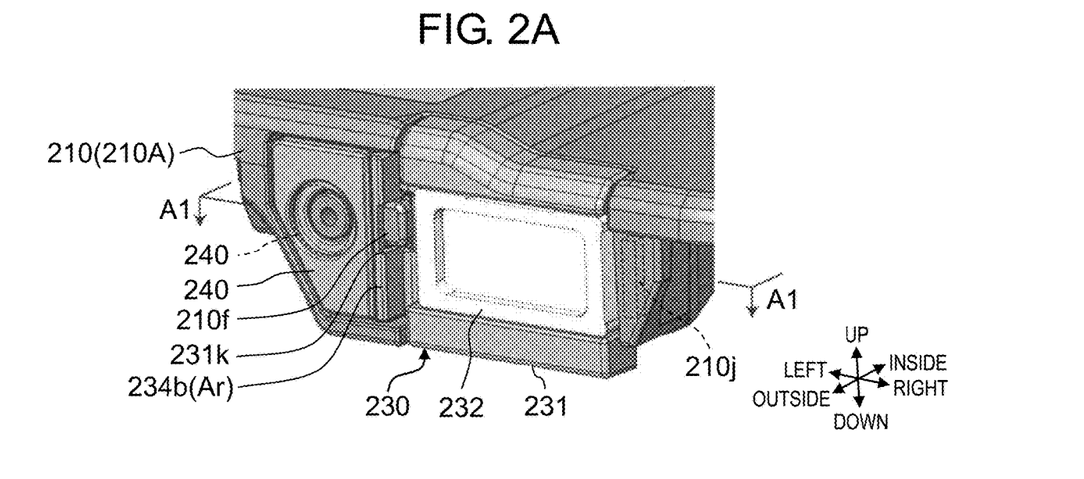
FIG. 2A is an enlarged perspective view of a lid disposition part of a keyboard unit and illustrates a state where a lid is closed.
Figure 2B:
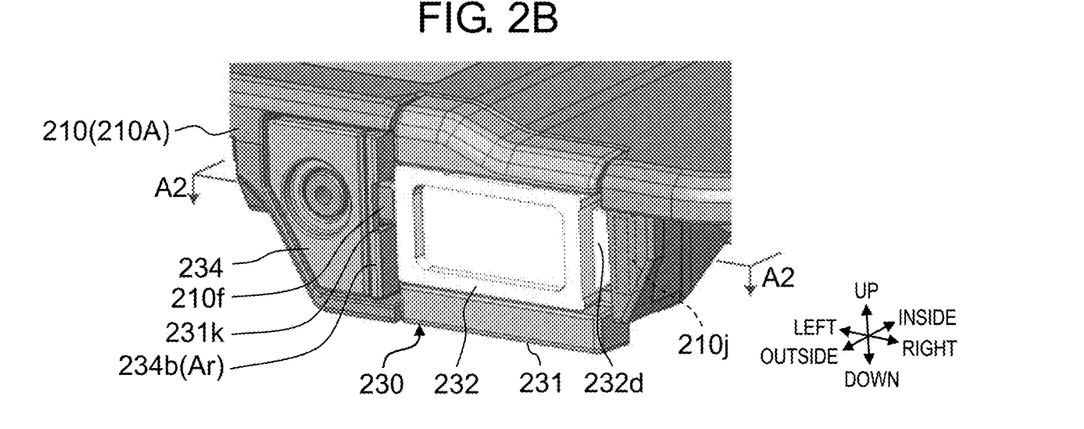
FIG. 2B is an enlarged perspective view of the lid disposition part of the keyboard unit and illustrates a state during transition from a state where the lid is opened to a state where the lid is closed.
Figure 2C:
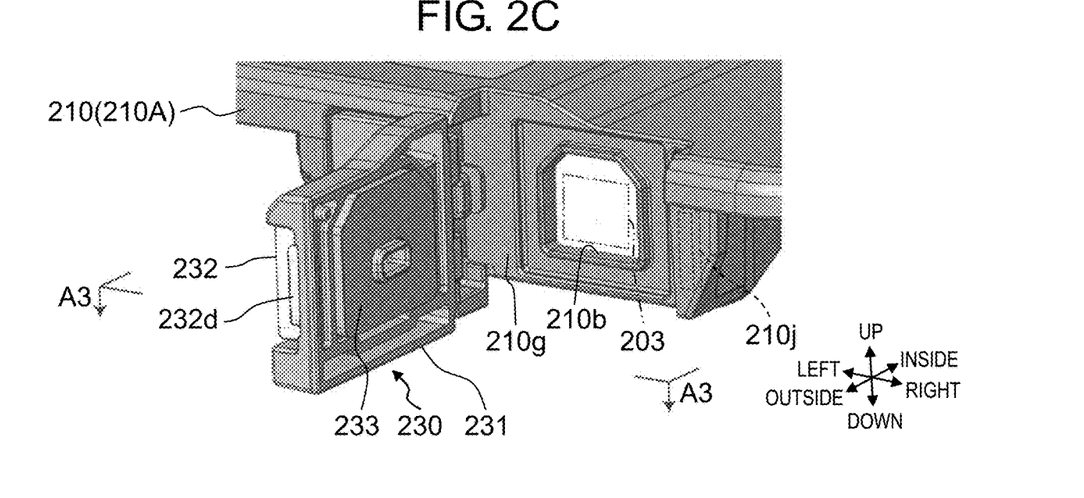
FIG. 2C is an enlarged perspective view of the lid disposition part of the keyboard unit and illustrates a state where the lid is opened.

FIGS. 2A, 2B, and 2C are enlarged perspective views of a lid disposition part of the keyboard unit. As illustrated in FIG. 1, housing 210 is constituted by upper housing 210A and lower housing 210B. In FIGS. 2A, 2B, and 2C, illustration of lower housing 210B is omitted. Screw 240 for fixing fixing plate 234 of lid 230 to housing 210 is indicated by the broken line.

FIG. 2A illustrates a state where lid 230 is closed. Lid 230 has inner lid 231 and outer lid 232 that is slidable relative to inner lid 231 in a left-right direction. Lid 230 is configured so as to be movable rotationally about hinge axis Ar of hinge part 234b. As illustrated in FIG. 2B, lid 230 is opened by sliding outer lid 232 toward hinge part 234b and thereby releasing engagement between right protrusion 232d of outer lid 232 and engagement recess 210j of housing 210. This allows lid 230 to move rotationally about hinge axis Ar. Next, as illustrated in FIG. 2C, lid 230 is opened by rotationally moving lid 230 about hinge axis Ar. This exposes opening 210b leading to LAN connector 203.

As illustrated in FIGS. 2A and 2B, engagement projection 210f of housing 210 fits in engagement hole 231k formed in a left end side of inner lid 231 in a state where lid 230 is closed. Lid 230 is fastened to housing 210 both on a right end side and a left end side in a state where outer lid 232 has been slid away from hinge axis Ar (rightward) as illustrated in FIG. 2A. Engagement projection 210f of housing 210 is provided on a trajectory along which engagement hole 231k of lid 230 moves rotationally about hinge axis Ar. Accordingly, engagement between engagement hole 231k of lid 230 and engagement projection 210f of housing 210 is released when lid 230 is opened by moving lid 230 rotationally.

Figure 3A:
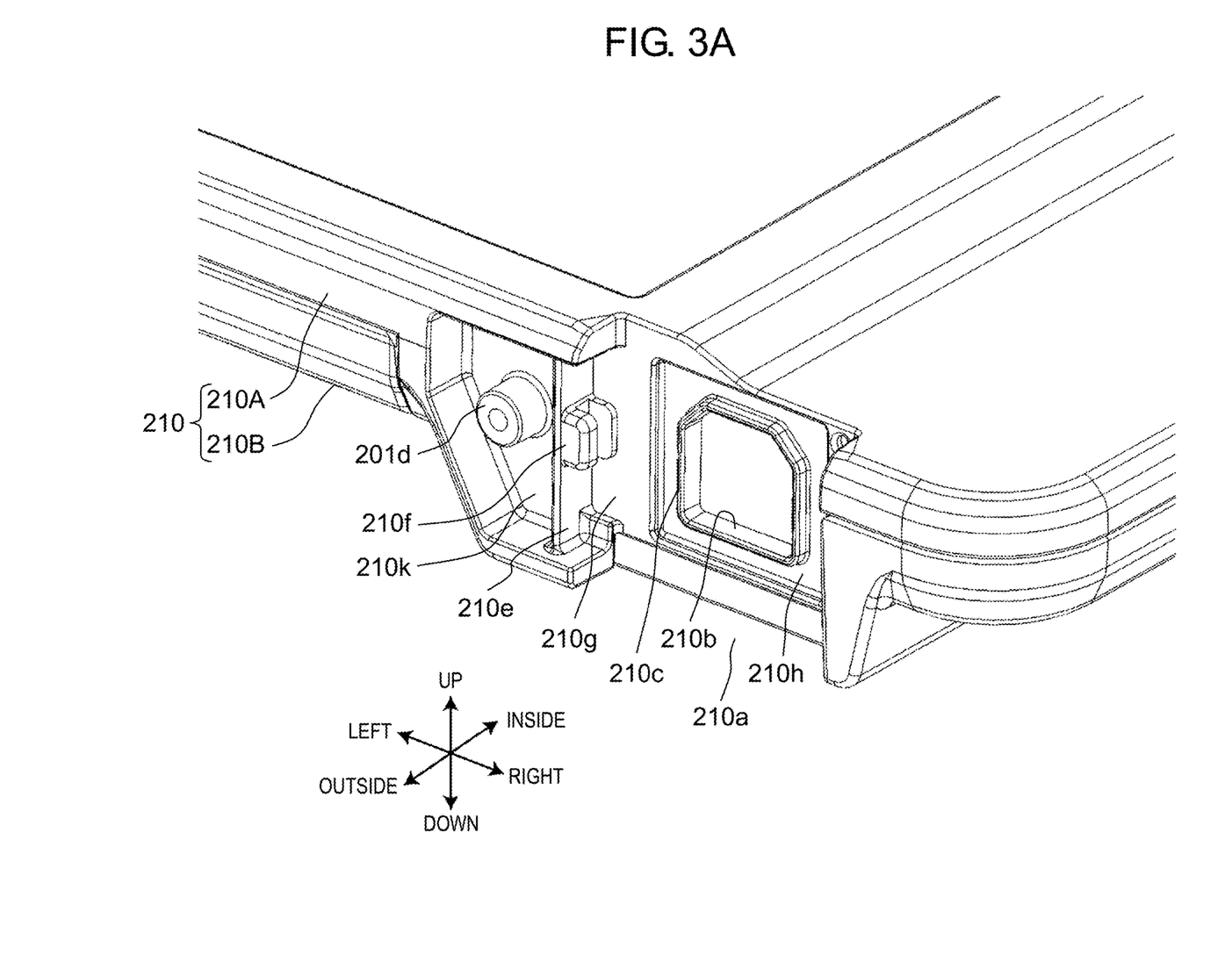
FIG. 3A is an enlarged perspective view of the lid disposition part of a housing of the keyboard unit.
Figure 3B:
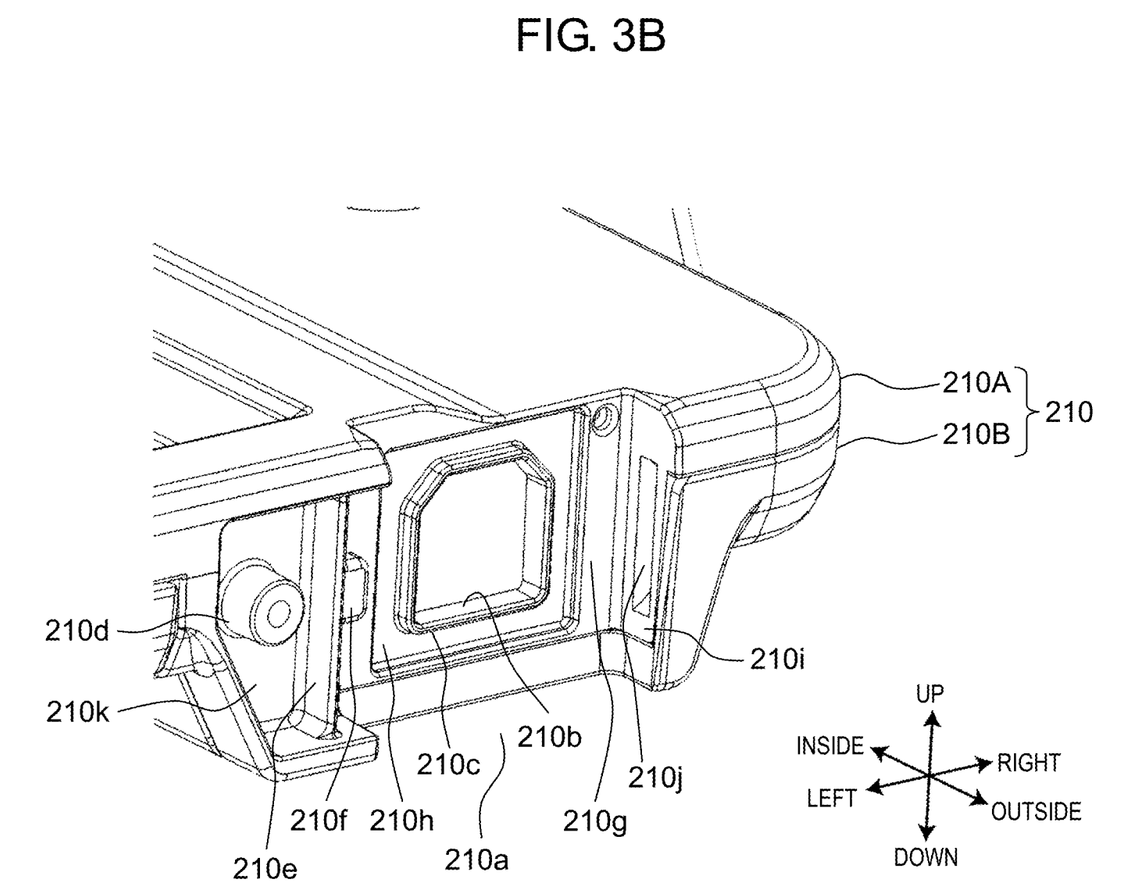
FIG. 3B is an enlarged perspective view of the lid disposition part of the housing of the keyboard unit.
Figure 4A:
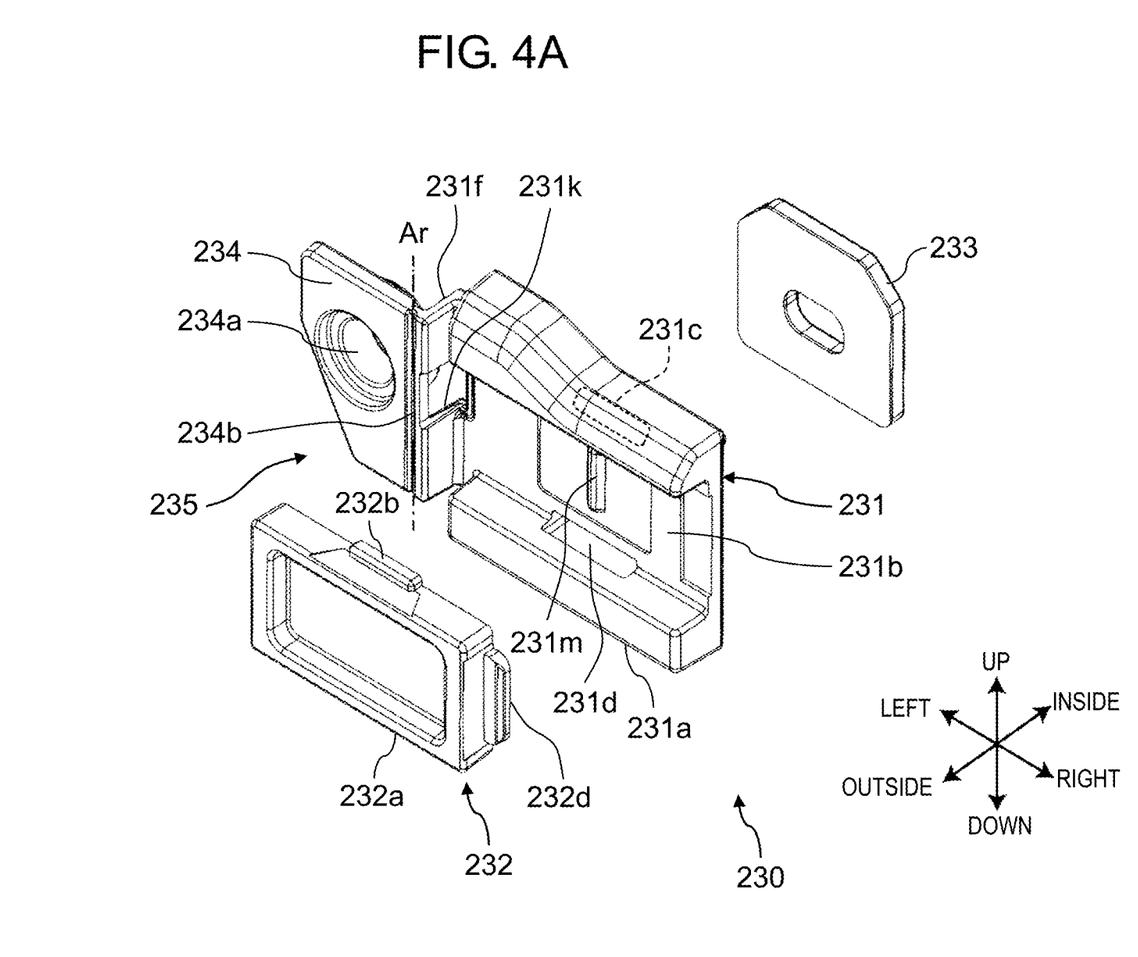
FIG. 4A is an exploded perspective view of the lid.
Figure 4B:
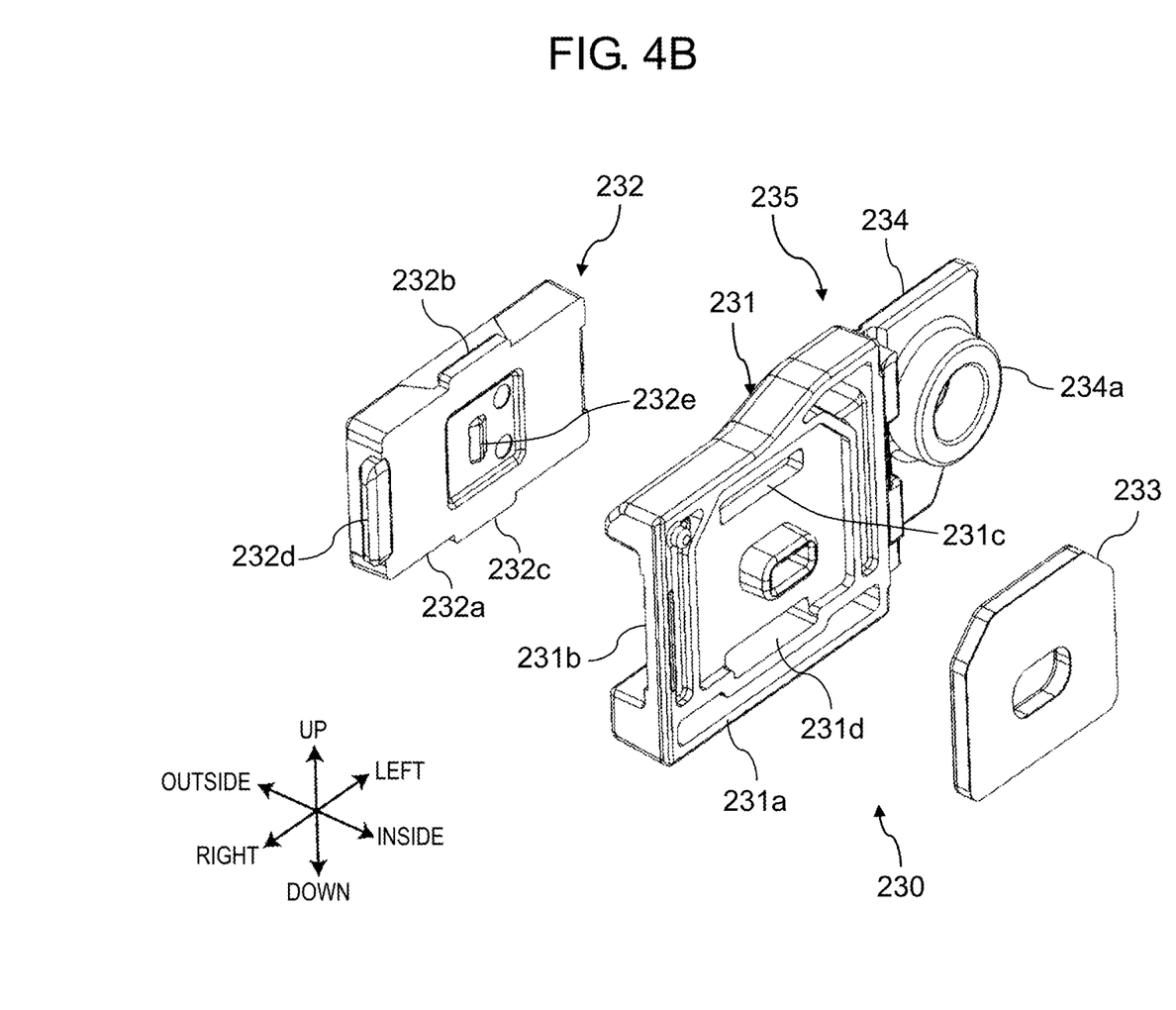
FIG. 4B is an exploded perspective view of the lid.

Next, a structure of a part where lid 230 is provided in computer 1 is more specifically described with reference to FIGS. 3A, 3B, 4A, and 4B. FIGS. 3A and 3B are enlarged perspective views of the lid disposition part of housing 210 of keyboard unit 200. FIG. 3A is a perspective view of the lid disposition part viewed from an upper right side, and FIG. 3B is a perspective view of the lid disposition part viewed from an upper left side. FIGS. 4A and 4B are exploded perspective views of lid 230. FIG. 4A is an exploded perspective view of lid 230 viewed from an outer surface side, and FIG. 4B is an exploded perspective view of lid 230 viewed from an inner surface side. In FIG. 3A and the subsequent drawings, directions are described for convenience for the purpose of explanation and easier understanding. The directions are based on a state where a side part of keyboard unit 200 on which lid 230 is provided is viewed from a front side, but it is not intended that computer 1 should be used and disposed in these directions. In the example of these drawings, a left-right direction corresponds to a device front-rear direction (device depth direction), an inside-outside direction corresponds to a device width direction, and an up-down direction corresponds to a device thickness direction.

As illustrated in FIGS. 3A and 3B, first recess 210a into which lid 230 (inner lid 231) fits and second recess 210k into which fixing plate 234 fits are provided on a side part of housing 210. Screw boss 210d which fits into tubular part 234a of fixing plate 234 of inner lid member 235 is provided so as to stand on second recess 210k into which fixing plate 234 fits.

A central part of bottom surface 210g of first recess 210a is step-down surface 210h that steps down toward the housing inside. Step-down surface 210h has a size in which water stop member 233 fits. Step-down surface 210h of bottom surface 210g has opening 210b for LAN connector 203 described above. Furthermore, frame-shaped peripheral rib 210c that protrudes outward is provided along a periphery of opening 210b of step-down surface 210h.

Left side surface part 210e having a partition plate shape that constitutes a left side surface of first recess 210a is provided between first recess 210a and second recess 210k. Engagement projection 210f that protrudes toward first recess 210a is provided on left side surface part 210e.

Groove-shaped engagement recess 210j is provided on right side surface part 210i of first recess 210a.

As illustrated in FIGS. 4A and 4B, lid 230 has outer lid 232, inner lid member 235, and water stop member 233.

Outer lid 232 is made of a resin such as polycarbonate (PC) or acrylonitrile butadiene styrene (ABS). Note that the kind of resin is not limited to these. Outer lid 232 is a plate-shaped member having a substantially quadrangular shape, and upper protrusion 232b that protrudes upward, lower protrusion 232c that protrudes downward, and right protrusion 232d that protrudes rightward are provided on an upper side, a lower side, and a right side of outer lid 232, respectively. Furthermore, inner protrusion 232e that protrudes inward is provided on a surface of outer lid 232 (inner surface of outer lid 232) facing inner lid 231.

Inner lid member 235 has inner lid 231, fixing plate 234, and hinge part 234b. Hinge part 234b connects inner lid 231 and fixing plate 234. Inner lid member 235 is made of a resin such as polypropylene (PP) having durability against repeated bending. This allows hinge part 234b and inner lid 231 to be provided in a same component. In a case where a resin of which inner lid member 235 is made is not PP, inner lid member 235 may undesirably not withstand repeated bending and be broken. In this case, for example, one option is to use another component such as a metal hinge as a hinge of the lid, but this is not preferable in an electronic device from the perspective of design and weight. Hinge part 234b is thinner than inner lid 231 and fixing plate 234. This allows hinge part 234b to connect inner lid 231 and fixing plate 234 so as to be rotatable relative to each other about hinge axis Ar. Hinge axis Ar is parallel with bottom surface 210g of first recess 210a in a state where lid 230 is attached to housing 210.

Tubular part 234a extending inward is provided at an almost center of fixing plate 234.

Inner lid 231 has plate-shaped body 231a and vertical wall part 231f connected to a left end part of body 231a.

Body 231a is provided with groove-shaped recess 231b extending in the left-right direction. Outer lid 232 fits in recess 231b. Upper groove 231c is provided on an upper side surface of recess 231b, and lower groove 231d is provided on a lower side surface of recess 231b. In a state where outer lid 232 fits in inner lid 231, upper protrusion 232b of outer lid 232 fits in upper groove 231c, and lower protrusion 232c of outer lid 232 fits in lower groove 231d. Lengths of upper groove 231c and lower groove 231d in the left-right direction are set longer than lengths of upper protrusion 232b and lower protrusion 232c of outer lid 232 in the left-right direction, respectively. This allows outer lid 232 to slide in the left-right direction relative to inner lid 231. In other words, outer lid 232 is slidable along an outer surface of inner lid 231 in a direction perpendicular to hinge axis Ar.

Furthermore, outer protrusion 231m that protrudes outward is provided on a bottom surface (the outer surface of inner lid 231) of recess 231b of body 231a.

Vertical wall part 231f has a plate shape extending from the left end side of the bottom surface of recess 231b in a direction perpendicular to the bottom surface of recess 231b. Engagement hole 231k having a shape that can be engaged with engagement projection 210f of housing 210 is provided in a middle part of vertical wall part 231f in the up-down direction.

Water stop member 233 is made of urethane foam having elasticity and is attached to an inner surface of body 231a of inner lid 231 with use of a both-sided tape.

[1-3. Structure of Engagement Between Lid and Housing]

Figure 5A:
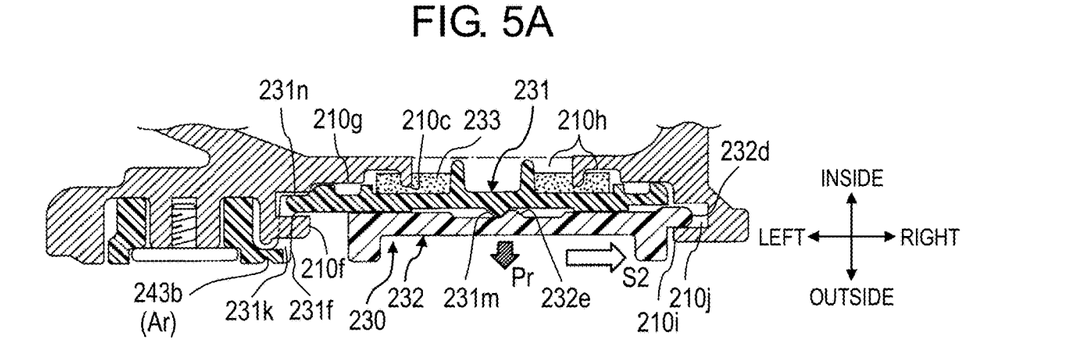
FIG. 5A is a cross-sectional view of the lid disposition part of the keyboard unit and illustrates a state where the lid is closed.
Figure 5B:
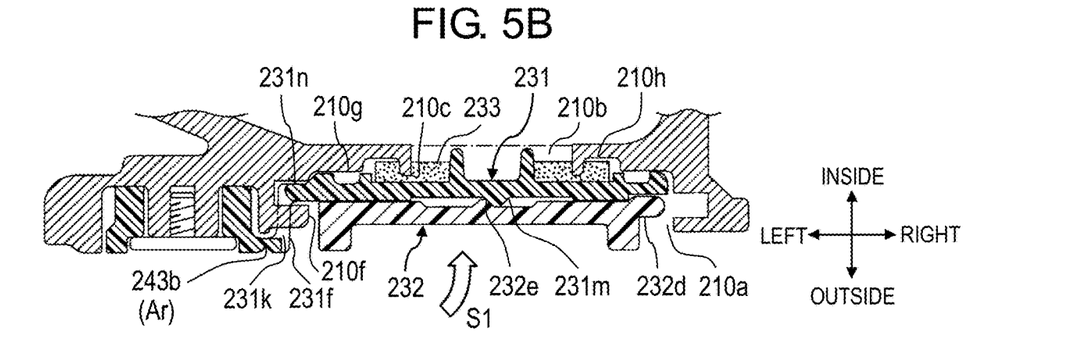
FIG. 5B is a cross-sectional view of the lid disposition part of the keyboard unit and illustrates a state during transition from a state where the lid is opened to a state where the lid is closed.
Figure 5C:
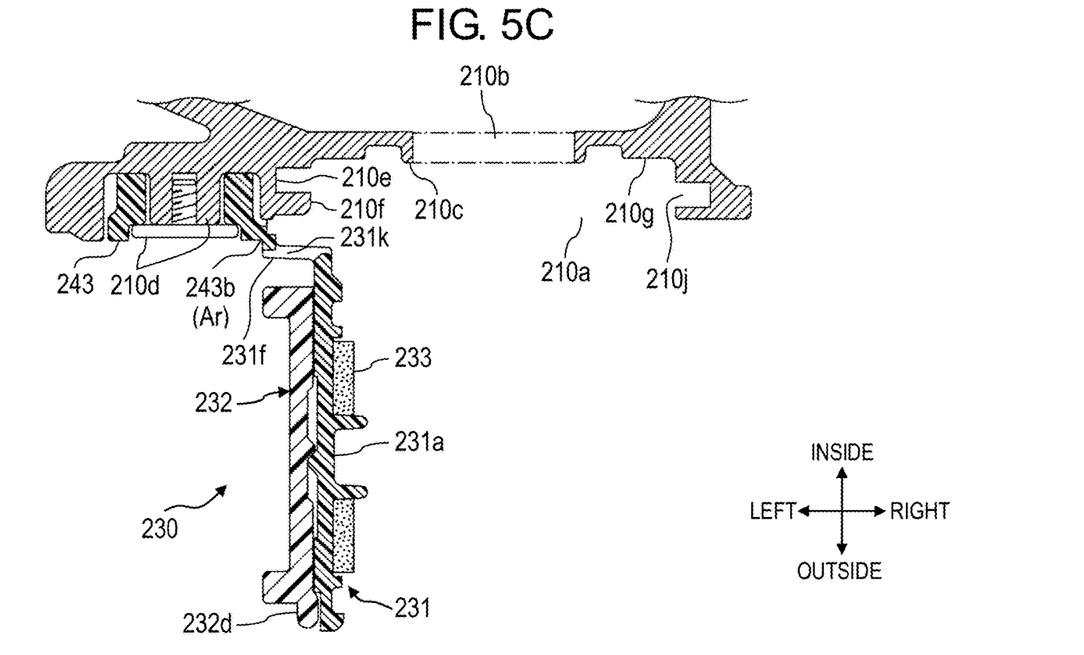
FIG. 5C is a cross-sectional view of the lid disposition part of the keyboard unit and illustrates a state where the lid is opened.

A structure of engagement between lid 230 and housing 210 is described in more detail based on an operation of closing lid 230 with reference to FIGS. 5A, 5B, and 5C in addition to FIGS. 2A, 2B, and 2C described above. FIGS. 5A, 5B, and 5C are cross-sectional views of the lid disposition part of keyboard unit 200. FIG. 5A illustrates a cross section taken along line A1-A1 of FIG. 2A. FIG. 5B illustrates a cross section taken along line A2-A2 of FIG. 2B. FIG. 5C illustrates a cross section taken along line A3-A3 of FIG. 2C.

In a state where lid 230 is opened illustrated in FIGS. 2C and 5C, lid 230 has been rotationally moved in an opening direction about hinge axis Ar, and opening 210b of housing 210 is exposed.

In order to close lid 230 from this state, first, lid 230 is fitted into first recess 210a by moving lid 230 rotationally about hinge axis Ar as indicated by arrow S1, as illustrated in FIGS. 2B and 5B. In this state, engagement projection 210f of housing 210 fits in engagement hole 231k of vertical wall part 231f that constitutes a left end part of inner lid 231. In other words, left end part 231n of the bottom surface of recess 231b of inner lid 231 is sandwiched between engagement projection 210f of housing 210 and bottom surface 210g. This restricts movement of left end part 231n of inner lid 231 in a direction departing from bottom surface 210g of first recess 210a of housing 210. That is, loosening of closing of a side of left end part 231n that is an end part of inner lid 231 close to hinge axis Ar is restricted.

Next, as illustrated in FIGS. 2A and 5A, outer lid 232 is slid rightward (away from hinge axis Ar) as indicated by arrow S2. As a result, right protrusion 232d of outer lid 232 fits in engagement recess 210j of right side surface part 210i of housing 210. This restricts movement of a right end side of outer lid 232 in a direction departing from bottom surface 210g of first recess 210a of housing 210. That is, loosening of closing of a right end part side that is an end part of inner lid 231 far from hinge axis Ar is restricted.

In the state where lid 230 is closed as illustrated in FIGS. 2A and 5A, water stop member 233 is pushed against peripheral rib 210c, and thereby peripheral rib 210c cuts into water stop member 233 so that peripheral rib 210c and water stop member 233 are in close contact with each other. This can prevent liquid such as water from entering from opening 210b into housing 210 in a good way.

As described above, in computer 1 according to the present exemplary embodiment, lid 230 is fastened to housing 210 not only on a right end side far from hinge axis Ar, but also on a left end side close to hinge axis Ar in a state where lid 230 is closed and outer lid 232 is slid to the right side. That is, lid 230 is fastened to housing 210 both on the right end side and the left end side. This suppresses loosening of closing of lid 230 even in a case where inner lid 231 is plastically deformed in the lid opening direction. As a result, the water proof performance of computer 1 is kept in a proper state.

A problem of a conventional electronic device will be described in more detail below. For example, a temperature inside a parked vehicle in summer sometimes reaches to a high temperature (e.g., 50 degrees or more) that cannot be reached under a normal use environment. In a case where an electronic device is left under such a high-temperature environment, a lid made of a resin may undesirably soften and plastically deform in a lid opening direction, and as a result waterproof performance may undesirably decrease.

Meanwhile, in computer 1 according to the present exemplary embodiment, lid 230 is fastened to housing 210 not only on the right end side far from hinge axis Ar, but also on the left end side close to hinge axis Ar. Accordingly, even if inner lid 231 is plastically deformed in the lid opening direction by application of force Pr applied in the opening direction to lid 230 by elastic force of water stop member 233 when inner lid 231 made of PP softens, inner lid 231 is hard to depart from bottom surface 210g of first recess 210a of housing 210.

Furthermore, in computer 1 according to the present exemplary embodiment, engagement hole 231k of vertical wall part 231f that constitutes the left end part of inner lid 231 and engagement projection 210f of housing 210 are automatically engaged when lid 230 is closed. It is therefore unnecessary for a user to separately perform an operation for engaging engagement hole 231k of the left end part of inner lid 231 and engagement projection 210f of housing 210.

Furthermore, in a process for sliding outer lid 232 away from hinge axis Ar, inner protrusion 232e of outer lid 232 climbs over outer protrusion 231m of inner lid 231. Then, inner protrusion 232e makes contact with outer protrusion 231m on a side farther from hinge axis Ar than outer protrusion 231m is. This restricts movement of outer lid 232 toward hinge axis Ar unless leftward operation force is applied by a user. This further improves waterproof performance. Note that inner protrusion 232e may be close to outer protrusion 231m on a side farther from hinge axis Ar than outer protrusion 231m is.

[2. Effects and Other Benefits]

Computer 1 (an example of an electronic device) according to the present exemplary embodiment has housing 210 including 210b provided in bottom surface 210g (predetermined surface); an electronic component in housing 210; hinge part 234b; and lid 230 that blocks opening 210b. Lid 230 is connected to housing 210 through hinge part 234b.

Lid 230 includes inner lid 231, outer lid 232, and water stop member 233 attached to an inner surface of inner lid 231.

Hinge part 234b has hinge axis Ar parallel with bottom surface 210g (predetermined surface), is connected to the left end part (one end) of inner lid 231, and supports inner lid 231 rotatably about hinge axis Ar.

Outer lid 232 is supported and slides along the outer surface of inner lid 231 in a direction perpendicular to hinge axis Ar.

Water stop member 233 blocks opening 210b by making contact with a periphery of opening 210b of bottom surface 210g (predetermined surface) by inner lid 231 when inner lid 231 is rotationally moved until inner lid 231 faces bottom surface 210g (predetermined surface).

Inner lid 231 includes engagement hole 231k (first engagement part) at an end of inner lid 231 on a side close to hinge axis Ar.

Housing 210 includes engagement projection 210f (second engagement part) that is engaged with engagement hole 231k (first engagement part) when inner lid 231 is rotationally moved until inner lid 231 faces bottom surface 210g (predetermined surface).

Outer lid 232 includes right protrusion 232d (third engagement part) at an end of outer lid 232 on a side far from hinge axis Ar.

Housing 210 includes engagement recess 210j (fourth engagement part) that is engaged with right protrusion 232d (third engagement part) when outer lid 232 is slid away from hinge axis Ar.

This allows lid 230 to be engaged with housing 210 not only at an end on a side far from hinge axis Ar, but also at an end on a side close to hinge axis Ar. This suppresses loosening of closing of lid 230 even in a case where lid 230 is plastically deformed in the lid opening direction. This suppresses a decrease in water proof performance of computer 1.

In the present exemplary embodiment, inner lid 231 and outer lid 232 each comprises a resin having elasticity.

Inner lid 231 includes outer protrusion 231m (first protrusion) that protrudes toward outer lid 232 on the outer surface of inner lid 231.

Outer lid 232 includes inner protrusion 232e (second protrusion) that protrudes toward inner lid 231 on the inner surface of outer lid 232.

In a process for sliding outer lid 232 away from hinge axis Ar, inner protrusion 232e (second protrusion) climbs over outer protrusion 231m (first protrusion).

In a state where right protrusion 232d (third engagement part) and engagement recess 210j (fourth engagement part) are engaged, inner protrusion 232e (second protrusion) is in contact with outer protrusion 231m (first protrusion) on a side farther from hinge axis Ar than outer protrusion 231m (first protrusion) is.

This restricts movement of outer lid 232 to a side close to hinge axis Ar due to a factor such as vibration or elasticity of water stop member 233. As a result, occurrence of a situation where engagement between right protrusion 232d (third engagement part) and engagement recess 210j (fourth engagement part) is cancelled by the above factor is suppressed.

In the present exemplary embodiment, housing 210 comprises a magnesium alloy.

Therefore, outward force applied to right protrusion 232d (third engagement) of lid 230 and engagement hole 231k (first engagement part) of lid 230 by water stop member 233 can be properly received by housing 210 that comprises a magnesium alloy having high rigidity. It is therefore possible to suppress movement of lid 230 in the opening direction.

In the present exemplary embodiment, opening 210b is an opening for LAN connector 203 (an example of a connector to which an external device or a cable is connected).

That is, a decrease in water proof performance of computer 1 having LAN connector 203 is suppressed.

Other Exemplary Embodiments

The first exemplary embodiment has been described above as an example of the technique disclosed in the present disclosure. However, the technique of the present disclosure is not limited to the first exemplary embodiment, and also applicable to other exemplary embodiments that undergo some modifications, replacements, additions, and omissions, for example, as appropriate. In addition, new embodiments can also be achieved by combining the respective constituent elements described in the first exemplary embodiment. Some other exemplary embodiments will be described below as examples.

(1) A case where the electronic device according to the present disclosure is applied to the keyboard unit of computer 1 has been described in the above exemplary embodiment. However, the electronic device according to the present disclosure is widely applicable to a tablet computer, a smartphone, a desktop computer, and other kinds of electronic devices.

(2) A case where the first engagement part of the present disclosure is constituted by engagement hole 231k (hole) and the second engagement part of the present disclosure is constituted by engagement projection 210f (projection) has been exemplified in the above exemplary embodiment. However, in the present disclosure, the first engagement part may be constituted by a recess and the second engagement part may be constituted by a projection. Alternatively, the first engagement part may be constituted by a projection and the second engagement part may be constituted by a recess or a hole.

(3) A case where the third engagement part of the present disclosure is constituted by right protrusion 232d (projection) and the fourth engagement part of the present disclosure is constituted by engagement recess 210j (recess) has been exemplified in the above exemplary embodiment. However, in the present disclosure, the fourth engagement part engaged with the third engagement part may be constituted by a hole. Alternatively, the third engagement part may be constituted by a recess or a hole and the fourth engagement part may be constituted by a projection.

(4) A case where the lid is a lid that blocks a housing opening for a LAN connector has been exemplified in the above exemplary embodiment. However, in the present disclosure, the lid may be a lid that blocks a housing opening for a connector to which a universal serial bus (USB) or an HDMI (registered trademark) connection cable, an external device, or the like is connectable. The lid may be a lid that blocks another opening of the housing of the electronic device.

The exemplary embodiments have been described above as examples of the technique in the present disclosure. For that purpose, the accompanying drawings and the detailed description have been provided. The components illustrated in the accompanying drawings and described in the detailed description can include components essential for solving the problems, as well as components that are not essential for solving the problems but required to describe the above technique as an example. Therefore, the components that are not essential should not be immediately recognized as being essential on the basis of the illustration of the components, which are not essential, in the accompanying drawings and the detailed description. Also, since the aforementioned exemplary embodiments are for describing the technologies of the present disclosure as an example, various modifications, replacements, additions, omissions, and the like may be made within the scope of the claims or a scope equivalent thereto.

INDUSTRIAL APPLICABILITY

The present disclosure can widely be used in electronic devices having a lid that blocks an opening of a housing.

REFERENCE MARKS IN THE DRAWINGS

1: computer
100: tablet computer
101: display
200: keyboard unit
201: keyboard
202: touch pad
203: LAN connector
210: housing
210A: upper housing
210B: lower housing
210a: first recess
210b: opening
210c: peripheral rib
210d: screw boss
210e: left side surface part
210f: engagement projection
210g: bottom surface
210h: step-down surface
210i: right side surface part
210j: engagement recess
210k: second recess
230: lid
231: inner lid
231a: body
231b: recess
231c: upper groove
231d: lower groove
231f: vertical wall part
231k: engagement hole
231m: outer protrusion
231n: left end part
232: outer lid
232b: upper protrusion
232c: lower protrusion
232d: right protrusion
232e: inner protrusion
233: water stop member
234: fixing plate
235: inner lid member
234a: tubular part
234b: hinge part
240: screw

The invention claimed is:

1. An electronic device comprising:
a housing including an opening provided in a predetermined surface of the housing;
an electronic component in the housing;
a hinge part; and
a lid that blocks the opening, the lid being connected to the housing through the hinge part, wherein
the lid includes an inner lid, an outer lid, and a water stop member attached to an inner surface of the inner lid,
the hinge part has a hinge axis parallel with the predetermined surface, is connected to one end of the inner lid, and supports the inner lid rotatably about the hinge axis,
the outer lid is supported by the inner lid and slides along an outer surface of the inner lid in a direction perpendicular to the hinge axis,
the water stop member blocks the opening by making contact with a periphery of the opening of the predetermined surface when the inner lid is rotationally moved until the inner lid faces the predetermined surface,
the inner lid includes a first engagement part at an end of the inner lid on a side close to the hinge axis,
the housing includes a second engagement part that is engaged with the first engagement part when the inner lid is moved rotationally until the inner lid faces the predetermined surface,
the outer lid includes a third engagement part at an end of the outer lid on a side far from the hinge axis,
the housing includes a fourth engagement part that is engaged with the third engagement part when the outer lid is slid away from the hinge axis,
the hinge part supports the first engagement part rotatably about the hinge axis relative to the housing,
the first engagement part includes a hole or a recess,
the second engagement part includes a projection, and
the projection is engaged with the hole or the recess when the inner lid is moved rotationally until the inner lid faces the predetermined surface.

2. The electronic device according to claim 1, wherein
the inner lid and the outer lid each comprise a resin having elasticity,
the inner lid includes a first protrusion that protrudes toward the outer lid on the outer surface of the inner lid,
the outer lid includes a second protrusion that protrudes toward the inner lid on an inner surface of the outer lid,
the second protrusion climbs over the first protrusion in a process for sliding the outer lid away from the hinge axis, and
the second protrusion is in contact with or close to the first protrusion on a side farther from the hinge axis than the first protrusion is, in a state where the third engagement part and the fourth engagement part are engaged with each other.

3. The electronic device according to claim 1, wherein the housing comprises a magnesium alloy.

4. The electronic device according to claim 1, wherein the opening is an opening for a connector to which an external device or a cable is connected.

5. The electronic device according to claim 1, wherein the projection protrudes in a direction parallel to the predetermined surface.

6. The electronic device according to claim 5, wherein
the housing includes a side surface perpendicular to the predetermined surface, and
the projection protrudes from the side surface.

7. The electronic device according to claim 1, wherein the projection protrudes toward the fourth engagement part.

8. The electronic device according to claim 1, wherein the hinge part is not between the first and the third engagement parts.

9. The electronic device according to claim 1, wherein a distance between the predetermined surface and the second engagement part is equal to a distance between the predetermined surface and the fourth engagement part.

* * * * *